United States Patent
Sato

(10) Patent No.: US 10,636,546 B2
(45) Date of Patent: Apr. 28, 2020

(54) POWER SUPPLY CABLE AND CONNECTOR-EQUIPPED POWER SUPPLY CABLE

(71) Applicant: FUJIKURA LTD., Tokyo (JP)

(72) Inventor: Nozomi Sato, Sakura (JP)

(73) Assignee: Fujikura Ltd., Tokyo (JP)

( * ) Notice: Subject to any disclaimer, the term of this patent is extended or adjusted under 35 U.S.C. 154(b) by 0 days.

(21) Appl. No.: 16/320,896

(22) PCT Filed: Jul. 26, 2017

(86) PCT No.: PCT/JP2017/027028
§ 371 (c)(1),
(2) Date: Jan. 25, 2019

(87) PCT Pub. No.: WO2018/021401
PCT Pub. Date: Feb. 1, 2018

(65) Prior Publication Data
US 2019/0164665 A1 May 30, 2019

(30) Foreign Application Priority Data

Jul. 29, 2016 (JP) .................................. 2016-149405

(51) Int. Cl.
*H01B 7/00* (2006.01)
*H01B 7/42* (2006.01)
(Continued)

(52) U.S. Cl.
CPC ............... *H01B 7/421* (2013.01); *H01B 7/00* (2013.01); *H01B 7/42* (2013.01); *H01B 9/00* (2013.01); *H05K 7/20336* (2013.01)

(58) Field of Classification Search
CPC ........ H01B 7/423; H01B 7/421; H01B 7/425; H01B 7/1895; H01B 9/00; H01B 9/006;
(Continued)

(56) References Cited

U.S. PATENT DOCUMENTS

| 3,643,002 A | * | 2/1972 | Minnich | ................ | H01B 12/06 |
| | | | | | 174/15.5 |
| 3,749,811 A | * | 7/1973 | Bogner | ................ | H01B 12/06 |
| | | | | | 174/15.5 |

(Continued)

FOREIGN PATENT DOCUMENTS

| CN | 201910261 U | 7/2011 |
| CN | 104616801 A | 5/2015 |

(Continued)

OTHER PUBLICATIONS

JIS-C-3005, Test methods for rubber or plastic insulated wires and cables; Japanese Standards Association, (2000) (32 pages).

(Continued)

*Primary Examiner* — Roshn K Varghese
(74) *Attorney, Agent, or Firm* — Osha Liang LLP

(57) ABSTRACT

A power supply cable includes: an even number of electric wires that each includes a flexible cooling pipe, an electric conductor that surrounds the cooling pipe, and an insulator that surrounds the electric conductor; a filling disposed around the even number of electric wires; and a sheath that covers the even number of the electric wires and the filling. The electric conductor is a plurality of conductor wires wound around the cooling pipe.

6 Claims, 4 Drawing Sheets

(51) Int. Cl.
*H01B 9/00* (2006.01)
*H05K 7/20* (2006.01)

(58) Field of Classification Search
CPC ........ H01B 11/02; H01B 12/08; H01B 12/12; H01B 12/16; H01B 15/24; H01B 7/00; H01B 7/42; H05K 7/20336; H02G 15/003; B60L 11/1818; B60L 11/1825; B60L 58/26
USPC .......................................................... 174/13
See application file for complete search history.

(56) References Cited

U.S. PATENT DOCUMENTS

| | | | |
|---|---|---|---|
| 5,909,099 | A | 6/1999 | Watanabe et al. |
| 6,350,947 | B1 * | 2/2002 | Bertini ................. H01B 7/2813 174/47 |
| 2001/0002773 | A1 | 6/2001 | Hyogo |
| 2009/0178825 | A1 | 7/2009 | Wu et al. |
| 2010/0218970 | A1 | 9/2010 | Eshima |
| 2012/0199390 | A1 | 8/2012 | Oka et al. |
| 2015/0217654 | A1 | 8/2015 | Woo et al. |
| 2017/0028862 | A1 * | 2/2017 | Nagel ................. B60L 11/1818 |
| 2017/0338006 | A1 * | 11/2017 | Gontarz ................. B60L 53/18 |

FOREIGN PATENT DOCUMENTS

| | | | |
|---|---|---|---|
| CN | 204332439 U | | 5/2015 |
| CN | 204695848 U | | 10/2015 |
| DE | 102011100389 A1 | | 5/2012 |
| JP | S40-23744 Y1 | | 8/1965 |
| JP | S49-123579 U1 | | 10/1974 |
| JP | S53-097384 U1 | | 8/1978 |
| JP | S53-112483 A | | 9/1978 |
| JP | S58-030010 A | | 2/1983 |
| JP | H07-211156 A | | 8/1995 |
| JP | H07-226112 A | | 8/1995 |
| JP | H10-106362 A | | 4/1998 |
| JP | 2000-133058 A | | 5/2000 |
| JP | 2001-160322 A | | 6/2001 |
| JP | 2004-135386 A | | 4/2004 |
| JP | 2009-170426 A | | 7/2009 |
| JP | 2010-225571 A | | 10/2010 |
| JP | 2012-164478 A | | 8/2012 |
| JP | 2016-110836 A | | 6/2016 |
| TW | M340532 U | | 9/2008 |

OTHER PUBLICATIONS

IEC 62196-1; 2011, Plugs, socket-outlets, vehicle connectors and vehicle inlets—Conductive charging of electric vehicle—Part 1: General requirements (2011) (39 pages).
Battery Charger Connector having Lead Cable for High-Speed Battery Charger, Battery Charger Connector having Lead Cable for High-Speed Battery Charger, Japan, Fujikura Ltd., Nov. 2014, URL, www.fujikura.co.jp/resource/pdf/td16001_2.pdf (1 page).
Notice of Reasons for Rejection issued in corresponding Japanese Patent Application No. 2016-149405 dated Aug. 30, 2016, with translation (6 pages).
Notice of Allowance issued in corresponding Japanese Patent Application No. 2016-149405 dated Nov. 15, 2016, with translation (6 pages).
Notice of Reasons for Rejection issued in corresponding Japanese Patent Application No. 2016-239759 dated Jan. 31, 2017, with translation (3 pages).
Notice of Allowance issued in corresponding Japanese Patent Application No. 2016-239759 dated Apr. 18, 2017, with translation (6 pages).
Office Action issued in corresponding Japanese Patent Application No. 2017-000382 dated May 16, 2017 (3 pages).
Decision of Rejection issued in corresponding Japanese Patent Application No. 2017-000382 dated Aug. 1, 2017 (3 pages).
Office Action issued in corresponding Japanese Patent Application No. 2017-000382 dated Mar. 13, 2018 (5 pages).
Notice of Reasons for Rejection issued in corresponding Japanese Patent Application No. 2017-212168 dated Dec. 5, 2017, with translation (4 pages).
Decision of Rejection issued in corresponding Japanese Patent Application No. 2017-212168 dated Feb. 20, 2018, with translation (4 pages).
Office Action issued in corresponding Taiwanese Patent Application No. 106125091 dated Apr. 13, 2018 (6 pages).
Office Action issued in corresponding Taiwanese Patent Application No. 106125091 dated Nov. 26, 2018 (6 pages).
Office Action issued in corresponding Chinese Application No. 201780045748.5 dated Jul. 16, 2019 (6 pages).

* cited by examiner

POWER SUPPLY CABLE AND CONNECTOR-EQUIPPED POWER SUPPLY CABLE

TECHNICAL FIELD

The present invention relates to a power supply cable, and a connector-equipped power supply cable.

Priority is claimed on Japanese Patent Application No. 2016-149405, filed on Jul. 29, 2016, the content of which is incorporated herein by reference in its entirety.

BACKGROUND

In recent years, a power supply cable in which electrification of a large electrical current of approximately 250 A, for example, is demanded, along with the spread of an electric automobile or the like. In the power supply cable of such a kind, temperature rises in the power supply cable or on a power supply cable surface (simply referred to as "inside and outside of the power supply cable", hereinafter) along with the electrification of the large electrical current.

There is a need to keep temperatures on the inside and outside of the power supply cable less than a predetermined temperature in order to prevent deterioration of a configuration member or fail to comply with a standard (for example, IEC 62196-1-16.5 or the like).

In order to prevent temperature rises on the inside and outside of the power supply cable along with the electrification, the power supply cables as disclosed in Patent Document 1 and Patent Document 2 are known, from the related art. Patent Document 1 or Patent Document 2 discloses a power supply cable that includes an electric conductor, a cooling pipe, and a sheath covering the electric conductor and the cooling pipe. According to the power supply cables, it is possible to cool the electric conductor which generates heat due to the electrification by the cooling pipe.

PATENT DOCUMENTS

[Patent Document 1] Japanese Unexamined Patent Application, First Publication No. H10-106362

[Patent Document 2] Japanese Unexamined Patent Application, First Publication No. 2000-133058

In the power supply cable disclosed in Patent Document 1, a cooling effect is unlikely to be influenced on the electric conductor which is disposed away from the cooling pipe, and temperature unevenness is generated on the inside and outside of the power supply cable. Due to the temperature unevenness, a portion of which the temperature is high is locally generated on the inside and outside of the power supply cable. If cooling ability is improved in order to keep the portion of which the temperature is high at a predetermined temperature or less, it leads to a case where a diameter of the cooling pipe is made large, or to a case where the size of a refrigerant circulating apparatus is made large.

On the other hand, Patent Document 2 proposes the power supply cable that includes the cooling pipe which is disposed inside of the electric conductor, and the cooling pipe which is wound around the sheath in a spiral shape. According to the power supply cable, the electric conductor is cooled from the inside and the outside, and thus, it is possible to improve the temperature unevenness on the inside and outside of the power supply cable. However, in order to uniformly cool the surface of the sheath, there is a need to wind the cooling pipe around the sheath at a short pitch, and thus, the total length of the cooling pipe becomes long. Furthermore, since the cooling pipe is wound around the sheath, the outer diameter of the whole power supply cable becomes large.

One or more embodiments of the present invention provide a power supply cable, and a connector-equipped power supply cable that are capable of efficiently cooling an electric conductor by reducing temperature unevenness which is generated on inside and outside of the power supply cable, while keeping the outer diameter of the power supply cable and the total length of a cooling pipe small.

SUMMARY

According to one or more embodiments a power supply cable used for power supply to an automobile includes: a plurality of electric wires being twisted together, each of which includes a cooling pipe having flexibility, an electric conductor surrounding the cooling pipe, and an insulator surrounding the electric conductor, and a sheath that covers the plurality of the electric wires.

According to one or more embodiments of the present invention, since each of the plurality of the electric wires includes the cooling pipe, and the electric conductor surrounding the cooling pipe, the electric conductor in each electric wire is cooled from an inside thereof, by the cooling pipe. Thereby, the inside of the electric wire which is a heat generating source is unbiasedly cooled, and thus, it is possible to reduce temperature unevenness on inside and outside the power supply cable, and it is possible to efficiently cool the electric conductor.

Furthermore, since the plurality of electric wires are twisted together, the electric wires are able to move appropriately whenever the power supply cable is twisted or bent. Thereby, it is able to prevent causing high tension and high stress locally on the electric wire. Accordingly, even in a case where the power supply cable is repeatedly twisted or bent, it is possible to prevent abnormalities such as leakage of a refrigerant.

According to one or more embodiments of the present invention, the power supply cable according to the first aspect further includes an even number of the electric wires, in which among the cooling pipes which are respectively included in the even number of the electric wires, half the number of the cooling pipes is used as an outward path of a refrigerant, and the remaining half the number of the cooling pipes is used as a return path of the refrigerant.

According to one or more embodiments of the present invention, the outward path and the return path of the refrigerant are disposed in the power supply cable, and thus, there is no need to dispose the cooling pipe on the outside of the power supply cable. Accordingly, it is possible to keep an outer diameter of the whole power supply cable small.

According to one or more embodiments of the present invention, in the power supply cable according to the first aspect or the second aspect, the electric conductor is configured by winding a plurality of conductor wires around the cooling pipe.

According to one or more embodiments of the present invention, it is possible to further uniformly cool the whole of the electric conductor, thereby, it is possible to reliably reduce temperature unevenness in the electric wire, and on the inside and outside of the power supply cable.

According to one or more embodiments of the present invention, in the power supply cable according to the third aspect, the conductor wire is configured by twisting a plurality of element wires together.

According to one or more embodiments of the present invention, flexibility of the conductor wire itself is increased, and thus, it is possible to further improve flexibility and durability of the power supply cable.

According to one or more embodiments of the present invention, in the power supply cable according to any one of the first aspect to the fourth aspect, the cooling pipe is formed of nylon or a silicone resin.

According to one or more embodiments of the present invention, the cooling pipe is formed of nylon or a silicone resin which is excellent in flexibility and mechanical strength, thereby, it is possible to further improve the flexibility and the durability of the power supply cable.

According to one or more embodiments of the present invention, in the power supply cable according to any one of the first aspect to the fifth aspect, outer diameters of the plurality of the electric wires may be substantially equal to each other.

According to one or more embodiments of the present invention, it is possible to achieve the cost down by commonizing each electric wire, and it is possible to further reliably reduce temperature unevenness on the inside and outside of the power supply cable, by making the surface temperature of each electric wire uniform.

According to one or more embodiments of the present invention, in the power supply cable according to any one of the first aspect to the sixth aspect, the plurality of the electric wires may be disposed at positions that are linearly symmetrical with respect to a straight line passing through a central axis of the power supply cable in a cross section view.

According to one or more embodiments of the present invention, an inside structure of the power supply cable is symmetrical, and thus, it is possible to further reliably reduce temperature unevenness on the inside of the power supply cable and the surface of the sheath.

According to one or more embodiments of the present invention, there is provided a connector-equipped power supply cable including the power supply cable according to any one of the first aspect to the seventh aspect, and a connector that is configured to connect to the automobile.

According to one or more embodiments of the present invention, it is possible to reliably cool the electric conductor while keeping the outer diameter of the whole power supply cable small, and thus, it is possible to provide the connector-equipped power supply cable that is capable of supplying the electricity with a large electrical current, and is excellent in operability.

According to one or more embodiments of the present invention, it is possible to provide a power supply cable, and a connector-equipped power supply cable that are capable of efficiently cooling an electric conductor by reducing temperature unevenness which is generated on inside and outside of the power supply cable, while keeping the outer diameter of the power supply cable and the total length of a cooling pipe small.

DETAILED DESCRIPTION

Hereinafter, a power supply cable according to one or more embodiments will be described with reference to FIG. 1 and FIG. 2. In each drawing which is used for the following description, the scale and dimension are appropriately modified in order to be easily understood.

Figure 1:
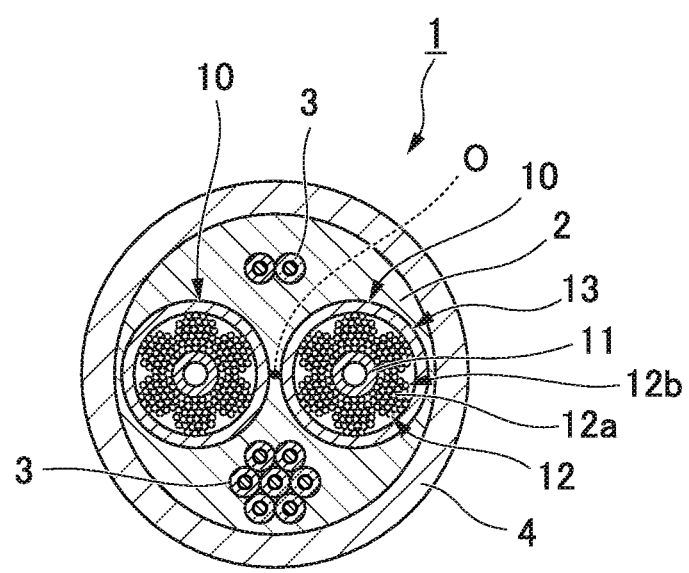
FIG. 1 is a cross-sectional view showing a configuration of a power supply cable according to one or more embodiments.

As shown in FIG. 1, a power supply cable 1 includes a plurality of electric wires 10, an filling 2, a plurality of auxiliary wires 3, and a sheath 4. In one or more embodiments, the power supply cable 1 includes two (even number) of the electric wires 10.

For example, the power supply cable 1 is a power supply cable that is compliant with CHAdeMo standard which is capable of rapidly charging a battery for an electric automobile. At the time of using the power supply cable 1, for example, a large electrical current of approximately 250 A flows through the electric wire 10. Since a user may directly touch a surface of the sheath 4 at the time of using the power supply cable 1, there is a need to maintain the temperature of the surface of the sheath 4 with a predetermined range.

Also, the power supply cable 1 may be accommodated by being partially wound or the like at the time of being not used. Therefore, durability against friction, durability against a case where bending and twisting are repeated, flexibility, and the like are demanded to the whole power supply cable 1. In order to easily handle the power supply cable 1 by the user, the outer diameter and the weight of the power supply cable 1 should be reduced.

(Direction Definition)

Here, in one or more embodiments, a direction along a central axis O of the power supply cable 1 is referred to as a longitudinal direction. A section which is orthogonal to the central axis O is referred to as a cross section, and a section which is along the central axis O is referred to as a longitudinal section. In a cross section view, a direction which is orthogonal to the central axis O is referred to as a radial direction, and a direction which circles around the central axis O is referred to as a circumferential direction.

The plurality of electric wires 10 and the plurality of auxiliary wires 3 are disposed at positions that are linearly symmetrical with respect to a straight line passing through the central axis O of the power supply cable 1, in a cross section view. The plurality of auxiliary wires 3 are disposed at positions which are away from the central axis O, in a cross section view. Each electric wire 10 and each auxiliary wire 3 are disposed within the sheath 4 in a state of being intertwined with each other, with the central axis O as a center.

The sheath 4 covers each electric wire 10 and each auxiliary wire 3 in a state of being integral with the filling 2. As a sheath 4, for example, it is possible to use chloroprene rubber.

The filling 2 is disposed in the vicinity of the electric wire 10 and the auxiliary wire 3. When the electric wire 10 and the auxiliary wire 3 are covered with the sheath 4, the filling 2 is used for setting the shape of contents thereof to be a cylinder shape. For example, in a case where the power supply cable 1 is stepped on by an automobile body, or the like, the filling 2 functions as a cushioning material that protects the electric wire 10 or the auxiliary wire 3 not to be damaged.

The auxiliary wire 3 is used for communication between a charger and a power supply target such as an electric automobile. In addition, the auxiliary wire 3 is used for controlling a lock mechanism of a connector, or is used as an electricity source wire of an LED which is lighted at the time of the electricity supply, or as a signal wire thereof in a case where the connector includes a temperature sensor. Furthermore, a portion of the auxiliary wire 3 may be used as an auxiliary power supply wire to the power supply target.

The electric wire 10 includes a cooling pipe 11, an electric conductor 12, and an insulator 13. The plurality of electric wires 10 are disposed at intervals within the sheath 4, in a cross section view. A space between the plurality of electric wires 10 is filled with the filling 2. The outer diameters of the plurality of electric wires 10 are substantially equal to each other.

The cooling pipe 11 is disposed at a center portion of the electric wire 10. As a cooling pipe 11, for example, it is possible to use a tube which is formed of Nylon 12. Since Nylon 12 is excellent in heat resistance and insulating properties, Nylon 12 is suitable as a material of the cooling pipe 11 that is in contact with the electric conductor 12 which generates heat due to electrification. Since Nylon 12 is also excellent in flexibility and mechanical strength, Nylon 12 is suitable as a material in the power supply cable 1 which is demanded to have flexibility and durability. As a material of the cooling pipe 11, for example, other materials such as a silicone resin may be appropriately used, in addition to Nylon 12.

An inside of the cooling pipe 11 is filled with a refrigerant such as a liquid refrigerant, air, water, or oil. The refrigerant in the cooling pipe 11 flows by a circulating apparatus which is not shown in the drawing. In one or more embodiments, dimensions of the cooling pipe 11 are made such that the outer diameter is 3.2 mm, and an inner diameter is 1.6 mm. In order to flow through the cooling pipe 11 of which the inner diameter is small in this manner, a material of which viscosity is low is suitable as a refrigerant. Since the power supply cable 1 may be used in a cold district, a refrigerant which is an antifreezing solution is suitable. The dimensions of the cooling pipe 11, and the properties of the refrigerant are not limited thereto, and may be appropriately modified.

The electric conductor 12 surrounds the cooling pipe 11. The electric conductor 12 is configured by winding a plurality of conductor wires 12b around the cooling pipe 11. In one or more embodiments, the electric conductor 12 is configured by winding six conductor wires 12b around the cooling pipe 11 in a spiral shape. The conductor wire 12b is configured by intertwining 34 element wires 12a with each other. Thereby, the electric conductor 12 is unbiasedly disposed in the vicinity of the cooling pipe 11. As each element wire 12a which configures the conductor wire 12b, for example, it is possible to use a tinned soft copper wire.

For example, in one or more embodiments, a direct electrical current of 250 A flows through the electric conductor 12. It is possible to appropriately modify the number of conductor wires 12b which are disposed in the vicinity of the cooling pipe 11, or the number and the materials of the respective element wires 12a which configure the conductor wire 12b.

The insulator 13 covers (surrounds) the electric conductor 12. As a material of the insulator 13, for example, it is possible to use EP rubber.

Figure 2:
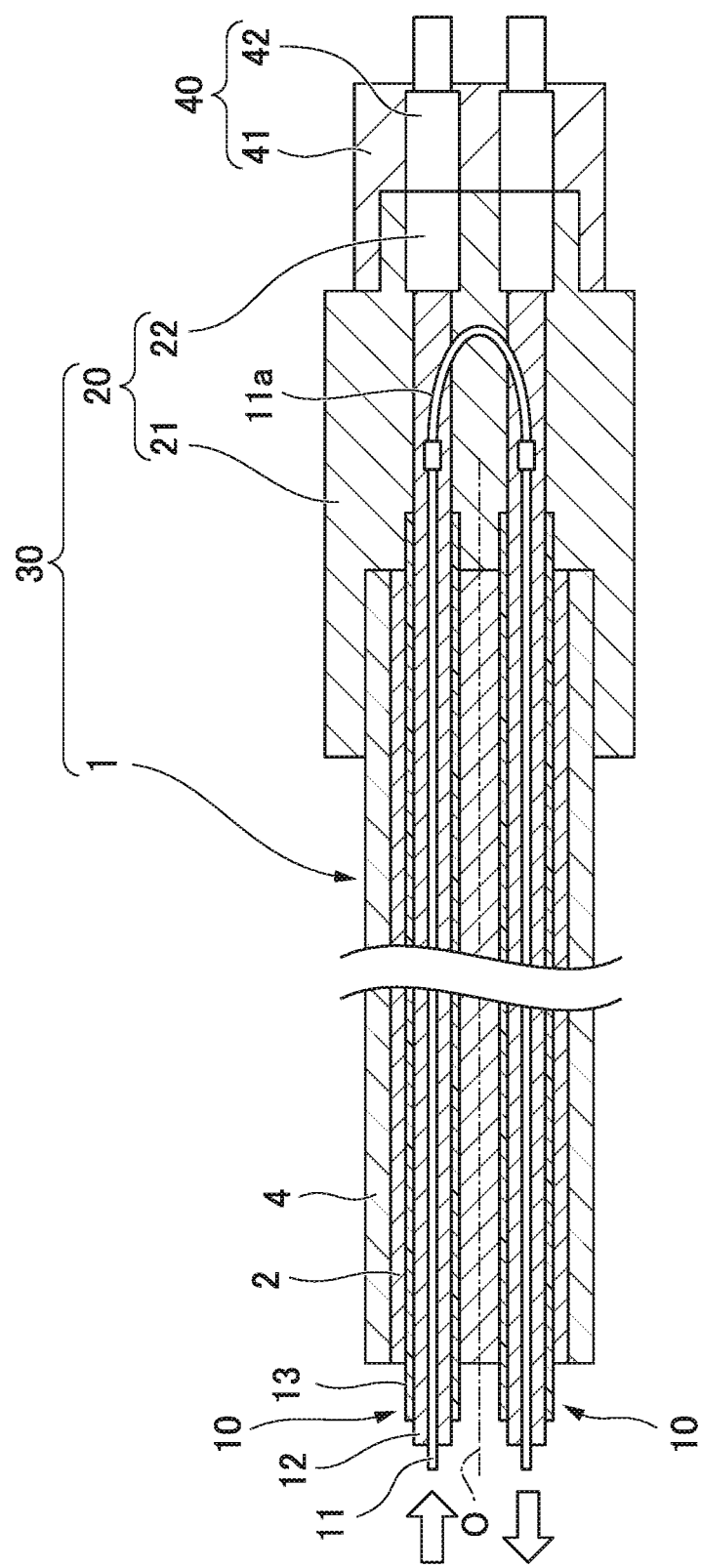
FIG. 2 is a longitudinal sectional view showing a configuration of a connector-equipped power supply cable that includes the power supply cable according to one or more embodiments.

FIG. 2 is a longitudinal sectional view obtained by cutting a connector-equipped power supply cable 30 which includes the power supply cable 1 along the central axis O. As shown in FIG. 2, the connector-equipped power supply cable 30 includes the power supply cable 1, and a connector 20 that is disposed at one end portion of the power supply cable 1. The connector 20 is connected to the power supply target such as an automobile.

As shown in FIG. 2, the cooling pipes 11 in two electric wires 10 are connected to each other by a connecting pipe 11a which is disposed in the connector 20. At the end portion of the power supply cable 1 on a side which is opposite to the connector 20, each cooling pipe 11 is connected to the charger that includes a function of causing the refrigerant to circulate, and is not shown in the drawing. Thereby, the inside of each cooling pipe 11 becomes an outward path or a return path of the refrigerant, and the refrigerant circulates in the power supply cable 1 and the connecting pipe 11a. In FIG. 2, illustration of a connection portion of the power supply cable 1 to the charger described above is omitted.

As shown in FIG. 2, the connector 20 includes a case 21, and a plurality of connector terminals 22. One end portion of the power supply cable 1 is accommodated within the case 21. Each electric conductor 12 in the respective electric wires 10 is electrically connected to each connector terminal 22. The cooling pipes 11 in the respective electric wires 10 are connected to each other by the connecting pipe 11a described above, in the case 21. Thereby, the refrigerant also passes through the case 21, and thus, it is possible to prevent a temperature rise of the case 21.

As shown in FIG. 2, the connector 20 is connected to a connection portion 40 which is included in the power supply target. The connection portion 40 includes an inlet 41, and a plurality of inlet terminals 42. The inlet terminal 42 is electrically connected to a battery or the like of the power supply target. If the connector 20 is inserted into the connection portion 40, the connector terminal 22 and the inlet terminal 42 are electrically connected to each other. Accordingly, the electricity which is output from the charger is input to the power supply target through the electric conductor 12 of the electric wire 10, the connector terminal 22, and the inlet terminal 42, thereby, it is possible to supply the electricity to the power supply target.

If the power supply is started by causing the power supply cable 1 to be connected to the power supply target, two electric conductors 12 respectively generate the heat. Since the cooling pipe 11 is disposed on the inside of the electric conductor 12, and the refrigerant flows through the cooling pipe 11, the electric conductor 12 is cooled from the inside thereof.

(Electrification Temperature Rising Test)

Next, an electrification temperature rising test was performed on the power supply cable 1 of one or more embodiments and a power supply cable in the related art, and the electrification temperature rising test will be described. Table 1 shows specifications and test results of the power supply cable 1 (Example) of one or more embodiments and the power supply cable (Comparative Example) in the related art.

TABLE 1

| | | Example | Comparative Example |
|---|---|---|---|
| Electric wire | Number | Two | Two |
| | Cooling pipe | Inner diameter: 1.6 mm<br>Outer diameter: 3.2 mm<br>Material: Nylon 12 | None |
| | Electric conductor | Six conductor wires (diameter of element wire: φ0.44 mm, the number of element wires: 32) were used.<br>Six conductor wires were twisted together around one cooling pipe which was used as a center.<br>Conductor cross-sectional area (six conductor wires) was 32 mm². | Six conductor wires (diameter of element wire: φ0.44 mm, the number of element wires: 32) were used.<br>Other six conductor wires were collectively intertwined with one cooling pipe which was used as a center.<br>Conductor cross-sectional area (seven conductor wires) was 38 mm². |
| Auxiliary wire | | φ2.2 mm × 9 | φ2.2 mm × 9 |
| Insulator | | EP rubber | EP rubber |
| Filling | | Tetoron thread | Tetoron thread |
| Sheath | | Chloroprene rubber of thickness of 2.8 mm | Chloroprene rubber of thickness of 2.8 mm |
| Refrigerant | | Water (temperature before being sent and distributed: 20° C., flow velocity: 1 m/sec) | None |
| Outer diameter of power supply cable | | 29.0 mm | 29.0 mm |
| Weight of power supply cable (including refrigerant) | | 1295 g/m | 1340 g/m |
| Total length of power supply cable | | 2 m | 2 m |
| Electrification current | | 250 A | 250 A |
| Temperature rise value of electric conductor (after 20 minutes from electrification start) | | Electric conductor of outward path cooling pipe: 20° C.<br>Electric conductor of return path cooling pipe: 24° C. | 70° C. |
| Temperature rise value of sheath surface (after 20 minutes from electrification start) | | 10° C. | 30° C. |

As shown in Table 1, in the test, water was used as a refrigerant of the power supply cable 1 in the Example, and was distributed at a flow velocity of 1 m/sec. The conductor wire 12b was configured by intertwining 34 element wires 12a which were formed of the tinned soft copper wires with each other. Furthermore, the electric conductor 12 was configured by winding six conductor wires 12b around the cooling pipe 11 in a spiral shape. The diameter of each element wire 12a is 0.44 mm. A cross-sectional area of the electric conductor 12 is 32 mm². As a cooling pipe 11, a tube that was formed of Nylon 12 of which the outer diameter was 3.2 mm, and the inner diameter was 1.6 mm was used.

As a power supply cable in the Comparative Example, a power supply cable in which the cooling pipe 11 in the Example was replaced with the conductor wire 12b was used. That is, the electric wire of the power supply cable in the Comparative Example does not include the cooling pipe 11, and includes seven conductor wires 12b. The cross-sectional area of the electric conductor in the Comparative Example is 38 mm².

As shown in Table 1, the outer diameters of two kinds of the whole power supply cables described above are the same at 29.0 mm. In this manner, it was possible to make a cross-sectional area size of the power supply cable 1 in the Example equal to that of the power supply cable in the Comparative Example. This is because the outer diameter (3.2 mm) of the cooling pipe 11 in the Example is substantially the same as the outer diameter of the conductor wire in the Comparative Example.

If cable weights (per 1 m) of the power supply cables in the Example and the Comparative Example are compared with each other, the power supply cable in the Example is lightened in weight than the power supply cable in the Comparative Example. This is because it is possible to make the weight of the whole power supply cable small by replacing one conductor wire in the Comparative Example with the cooling pipe 11 and the refrigerant (water).

Figure 3:
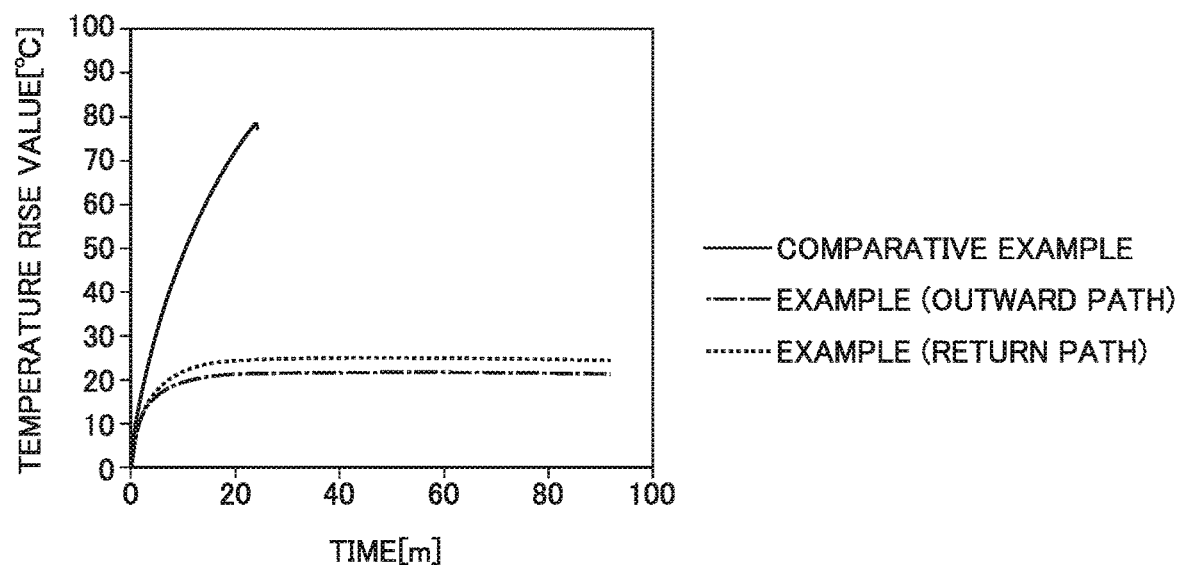
FIG. 3 is a graph showing results of an electrification temperature rising test on the power supply cables of one or more embodiments and a Comparative Example, and a vertical axis shows a temperature rise value of an electric conductor.

FIG. 3 show results obtained by electrifying the direct electrical current of 250 A with respect to two kinds of the power supply cables described above for 90 minutes, and measuring transitions in temperature of the respective electric conductors. The vertical axis of a graph shown in FIG. 3 indicates a temperature rise value (° C.), and shows the rise value of the temperature based on a room temperature. The horizontal axis of the graph shown in FIG. 3 indicates electrification time (minute).

The temperature of the electric conductor 12 of the power supply cable 1 of one or more embodiments is shown in FIG. 3, by measuring both cases where the cooling pipe 11 on the inside thereof is the outward path, and the return path. The temperature of the electric conductor 12 was measured by inserting a thermocouple from an outside of the power supply cable 1, and causing the thermocouple to be in contact with the electric conductor 12.

As shown in FIG. 3, in the power supply cable of the Comparative Example, the temperature rise value reaches at 70° C. at a point of time of 20 minutes after an electrification start, and the temperature also continues to rise thereafter. Regarding the power supply cable in the Comparative Example, the temperature rise value exceeded a heat resistant temperature (80° C.) of the insulator (EP rubber) covering the electric conductor at a point of time when the temperature rise value exceeded 70° C., and thus, the test was stopped. Therefore, the graph of Comparative Example shown in FIG. 3 is interrupted in the middle thereof.

On the contrary, in the power supply cable 1 of the Example, regarding both the outward path and the return path of the refrigerant, the temperature rise of the electric conductor 12 is stopped at approximately 20 minutes after the electrification start, and thereafter, the temperature rise value is kept being substantially fixed. For example, in the cooling pipe 11 of the outward path, the temperature rise value of the electric conductor 12 is kept being fixed after the temperature rise value thereof reaches at 20° C. In the cooling pipe 11 of the return path, the temperature rise value of the electric conductor 12 is kept being fixed after the temperature rise value thereof reaches at 24° C. This is considered to be caused because the heat generation of the electric conductor 12, and a cooling effect due to the refrigerant reach an equilibrium state. Therefore, according to the power supply cable 1 of the Example, it is considered that the temperature rises up to 20 minutes from the electrification start, and the temperature is kept being fixed without rising thereafter. Moreover, the result is made such that the temperature rise value of the electric conductor 12 in the return path of the refrigerant becomes approximately 24° C. at most, and is sufficiently lower than the heat resistant temperature (80° C.) of EP rubber which is used as an insulator 13 of the electric wire 10. A case where the temperature of the electric conductor 12 in the return path is higher than that in the outward path is considered to be caused because the refrigerant which is heated in the cooling pipe 11 of the outward path flows through the cooling pipe 11 of the return path, thereby, the cooling effect is slightly lowered.

Figure 4:
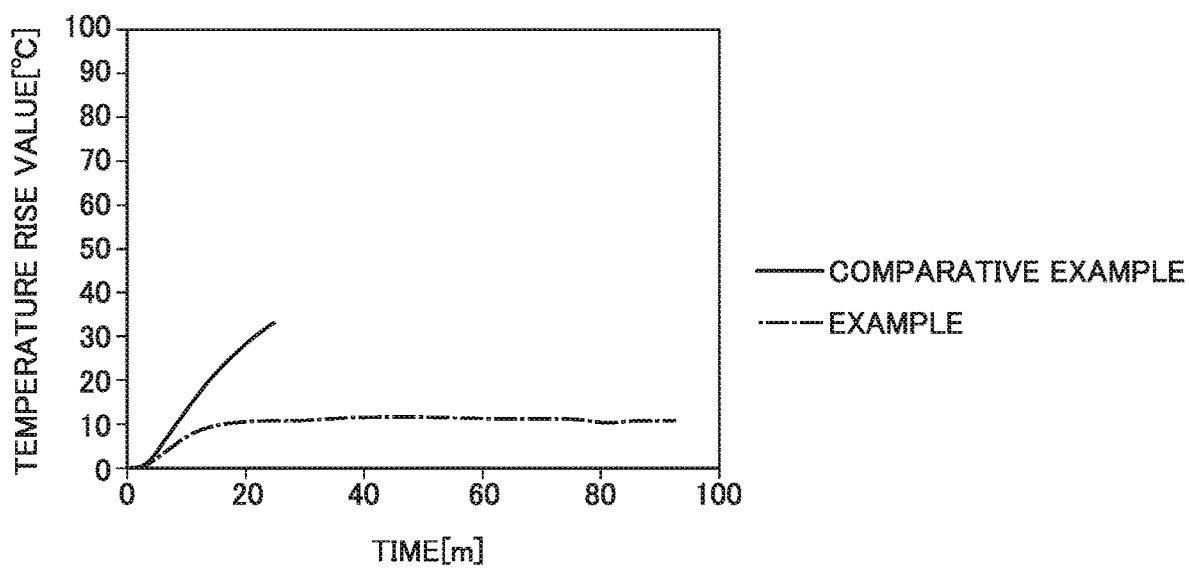
FIG. 4 is a graph showing results of the electrification temperature rising test on the power supply cables of one or more embodiments and the Comparative Example, and a vertical axis shows a temperature rise value of a sheath surface.

FIG. 4 shows a result obtained by measuring the temperature of a sheath surface, under the conditions which are the same as those of FIG. 3. The temperature of the sheath surface was measured by causing the thermocouple to be in contact with the sheath surface.

As shown in FIG. 4, the rise value of the surface temperature of the sheath in the Comparative Example reaches at 30° C. in 20 minutes from the electrification start. A case where the graph of the Comparative Example was interrupted in the middle thereof was because the test was stopped since the temperature of the electric conductor reached at the heat resistance temperature of the insulator in the same manner as FIG. 3.

On the contrary, the rise value of the surface temperature of the sheath 4 in the Example rises up to 10° C. in 20 minutes from the electrification start, but thereafter, the temperature rise value of 10° C. is stable as it is. Thereby, according to the power supply cable 1 of the Example, for example, it is possible to comply with a standard such as IEC 62196-1-16.5.

(Twisting and Bending Test)

Next, result obtained by carrying out a twisting test and a bending test on the power supply cable 1 of the Example will be described. In the following twisting test and bending test, the power supply cable that was the same as the power supply cable 1 of the Example which was used for the electrification temperature rising test was used.

In the twisting test, one end portion of the power supply cable 1 was used as a fixed end, and a portion which was separated by 1 m in the longitudinal direction with the fixed end as a center was swung by reciprocating in a scope of ±180° C. The velocity of the swing is 10 seconds per one reciprocation. In the present twisting test, the swing was executed by 20,000 reciprocations.

Regarding the bending test, in compliance with JIS-C-3005, a bent semidiameter was referred to as 5D, and the power supply cable 1 was bent 20,000 times.

Even after the twisting test and the bending test described above, abnormality such as leakage of the refrigerant was not generated in the cooling pipe 11. The first reason for obtaining such a result is that the cooling pipe 11 is formed of Nylon 12 which is excellent in flexibility and mechanical strength. The second reason thereof is that the electric wire 10 is appropriately moved whenever the twisting is performed, thereby, preventing high tension and stress from acting locally on the electric wire 10 since the electric wire 10 and the auxiliary wire 3 are disposed within the sheath 4 in a state of being intertwined with each other.

As described above, according to the power supply cable 1 of one or more embodiments, each of two electric wires 10 includes the cooling pipe 11, and the electric conductor 12 surrounding the cooling pipe 11, and thus, the electric conductor 12 in each electric wire 10 is cooled by the cooling pipe 11 from the inside thereof. Thereby, the inside of the electric wire 10 which is a heat generating source is unbiasedly cooled, and thus, it is possible to limit temperature unevenness on inside and outside the power supply cable 1 from being generated, and it is possible to efficiently cool the electric conductor 12.

Furthermore, since two electric wires 10 including the cooling pipes 11 are disposed in the power supply cable 1, it is possible to cause the refrigerant to circulate without disposing the cooling pipe 11 on the outside of the power supply cable 1, by making each cooling pipe 11 the outward path or the return path of the refrigerant. Thereby, it is possible to provide the compact power supply cable 1 in which the outer diameter of the whole power supply cable 1 and the total length of the cooling pipe 11 are prevented from being large.

Since the electric conductor 12 is configured by winding the plurality of conductor wires 12b around the cooling pipe 11, it is possible to unbiasedly dispose the electric conductor 12 in the vicinity of the cooling pipe 11. Thereby, it is possible to further uniformly cool the whole of the electric conductor 12, and it is possible to reliably reduce the temperature unevenness in the electric wire 10, and on the inside and outside of the power supply cable 1.

Since the outer diameters of the plurality of electric wires 10 are substantially equal to each other, it is possible to achieve the cost down by commonizing each electric wire 10, and it is possible to further reliably reduce the temperature unevenness on the inside and outside of the power supply cable 1, by making the surface temperature of each electric wire 10 uniform.

Since the plurality of electric wires 10 and the plurality of auxiliary wires 3 are disposed at the positions that are linearly symmetrical with respect to the straight line passing through the central axis O of the power supply cable 1, in a cross section view, it is possible to further reliably reduce the temperature unevenness on the inside of the power supply cable 1 and an outer surface (surface of the sheath 4) thereof.

The plurality of auxiliary wires 3 are disposed at the positions which are away from the center of the power supply cable 1, in a cross section view. Accordingly, it is possible to further reliably achieve an effect of preventing excessive stress and tension from acting on the auxiliary wire, by twisting the auxiliary wires 3 together in a spiral shape within the sheath.

Figure 5:
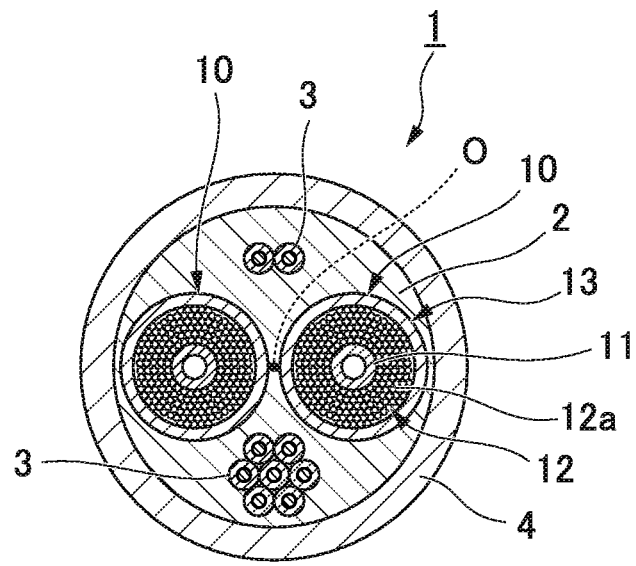
FIG. 5 is a cross-sectional view showing a Modification Example of the power supply cable in FIG. 1.

In one or more embodiments described above the electric conductor 12, which is configured by winding the plurality of conductor wires 12b around the cooling pipe 11, is used but one or more embodiments of the present invention is not limited thereto. For example, as shown in FIG. 5, the electric conductor 12 which is configured by winding the plurality of element wires 12a around the cooling pipe 11 in a spiral shape may be adopted. In this case, the electric conductor 12 is disposed in a concentric annuli shape with the cooling pipe 11 as a center in a cross section view. As an element wire 12a, for example, it is possible to use the tinned soft copper wire of which the diameter is 0.4 mm.

Next, one or more embodiments of the present invention will be described, but a basic configuration thereof is the same as that of one or more embodiments described above. Therefore, the same reference signs are attached to the same configurations, thereby, the description thereof will be omitted, and only points which are different from each other will be described.

In one or more embodiments, the number of electric wires 10 and the position of the auxiliary wire 3 which are disposed in the sheath 4 are different from those of one or more embodiments described above.

Figure 6:
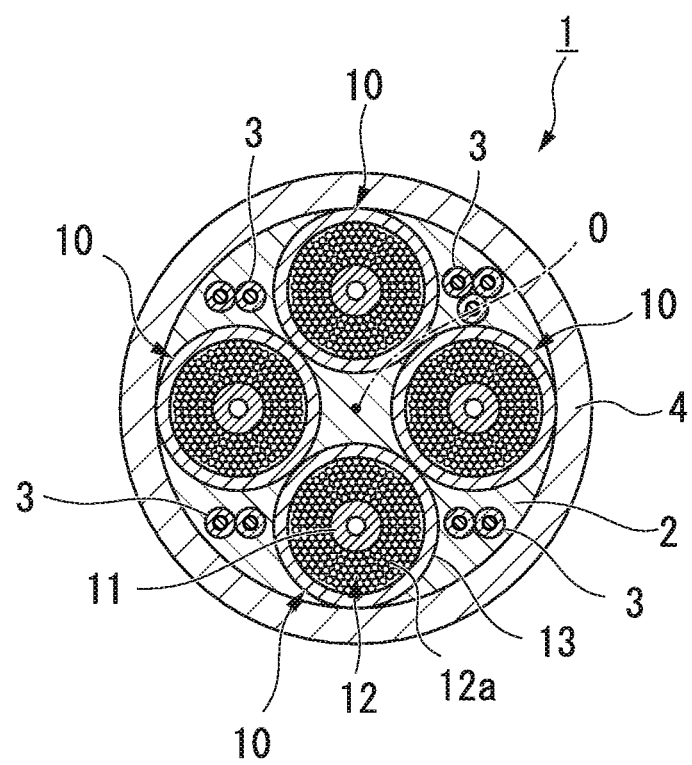
FIG. 6 is a cross-sectional view showing a configuration of a power supply cable according to one or more embodiments.

As shown in FIG. 6, in one or more embodiments, four electric wires 10 are disposed in the sheath 4. The plurality of auxiliary wires 3 are disposed at the positions which are separated from the central axis O of the power supply cable 1, in a cross section view.

According to the power supply cable 1 of one or more embodiments, four electric wires are disposed, and thus, it is possible to electrify the larger electrical current. Since four cooling pipes 11 are disposed, it is possible to cause the refrigerant to circulate without disposing the cooling pipe 11 on the outside of the power supply cable 1, by making two by two among four cooling pipes 11 the outward path or the return path of the refrigerant.

Since the plurality of auxiliary wires 3 are disposed at the positions which are away from the center of the power supply cable 1, it is possible to further reliably achieve the effect of preventing excessive stress and tension from acting on the auxiliary wire, by twisting the auxiliary wires 3 together in a spiral shape within the sheath.

The technical scope of the present invention is not limited to the embodiments described above, and it is possible to add various modifications thereto within the scope without departing from the gist of the present invention.

For example, in the embodiments described above, the power supply cable 1 including two or four electric wires 10 is described, but the present invention is not limited thereto, and the power supply cable 1 may include the even number of electric wires 10 which are six or more. The power supply cable 1 includes the even number of electric wires 10, and half the number of the cooling pipes 11 is used as an outward path of the refrigerant, and the remaining half the number of the cooling pipes 11 is used as a return path of the refrigerant, thereby, it is possible to cause the refrigerant to circulate without disposing the cooling pipe 11 on the outside of the power supply cable 1.

In addition, within the scope without departing from the gist of the present invention, it is possible to appropriately replace components in the embodiments described above with well-known components, and it is possible to appropriately combine the embodiment described above and the Modification Examples.

DESCRIPTION OF THE REFERENCE SYMBOLS

1: power supply cable
2: filling
3: auxiliary wire
4: sheath
10: electric wire
11: cooling pipe
12: electric conductor
12a: element wire
12b: conductor wire
13: insulator
20: connector
30: connector-equipped power supply cable Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

The invention claimed is:

1. A connector-equipped power supply cable comprising:
   a connector that connects to a power supply target;
   an even number of electric wires that each includes a flexible cooling pipe that circulates a liquid refrigerant, an electric conductor that surrounds the cooling pipe, and an insulator that surrounds the electric conductor;
   a filling disposed around the even number of electric wires; and
   a sheath that covers the even number of electric wires and the filling, wherein
   the electric conductor is a plurality of conductor wires wound around the cooling pipe,
   the cooling pipe is nylon,
   the cooling pipes included in two electric wires among the even number of electric wires are connected to each other by a connecting pipe disposed in the connector,
   the connecting pipe is bent so that two end portions of the connecting pipe connect to the cooling pipes in the connector, and
   the liquid refrigerant passes through the connector via the connecting pipe.

2. The connector-equipped power supply cable according to claim 1, wherein among the cooling pipes, which are respectively included in the even number of the electric wires, half of the cooling pipes are used as an outward path of the liquid refrigerant and half of the cooling pipes are used as a return path of the liquid refrigerant.

3. The connector-equipped power supply cable according to claim 1,
   wherein a plurality of auxiliary wires are disposed inside the sheath and outside the even number of electric wires, and
   wherein the even number of electric wires and the auxiliary wires are twisted into a spiral shape within the sheath.

4. The connector-equipped power supply cable according to claim 3, wherein the auxiliary wires are disposed at positions away from a center of the power supply cable in a cross section view of the power supply cable.

5. The connector-equipped power supply cable according to claim 1, wherein each of the cooling pipes has an outer diameter of 3.2 mm and an inner diameter of 1.6 mm.

6. The connector-equipped power supply cable according to claim 1, wherein the filling is made of Tetron thread.

* * * * *